US007030815B2

(12) United States Patent
Dunn et al.

(10) Patent No.: US 7,030,815 B2
(45) Date of Patent: Apr. 18, 2006

(54) INTEGRATED PATCH ANTENNA AND ELECTRONICS ASSEMBLY AND METHOD FOR FABRICATING

(75) Inventors: Gregory J. Dunn, Arlington Heights, IL (US); Jeffrey M. Petsinger, Wayne, IL (US); William R. Ziemer, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/936,286

(22) Filed: Sep. 8, 2004

(65) Prior Publication Data

US 2006/0049986 A1 Mar. 9, 2006

(51) Int. Cl.
*H01Q 1/38* (2006.01)
(52) U.S. Cl. .............................. 343/700 MS; 343/846
(58) Field of Classification Search ......... 343/700 MS, 343/702, 846
See application file for complete search history.

(56) References Cited

U.S. PATENT DOCUMENTS 6,469,673 B1 * 10/2002 Kaiponen .................... 343/703

* cited by examiner

*Primary Examiner*—Hoang V. Nguyen

(57) ABSTRACT

An integrated patch antenna and electronics assembly (300) comprises an antenna dielectric layer (305), a ground plane layer (310) disposed on a first side of the antenna dielectric layer, a printed circuit dielectric layer (315) disposed on the ground plane layer opposite the antenna dielectric layer, a patterned conductive metal foil layer (320) on a component surface (323) of the assembly (300), and a conductive metal foil antenna patch (325) disposed on a second side of the antenna dielectric layer that is in a patch side (391) of the assembly. In some embodiments, a plated through hole (330) couples the antenna patch to the patterned conductive metal foil layer. In some embodiments, there are one or more printed circuit dielectric layers (316, 341, 346, 351) disposed over the antenna patch on the antenna patch side of the assembly. In some embodiments, pairs of printed circuit dielectric layers ([315, 316], [340, 341], [345, 346], [350, 351]) are formed simultaneously on each side of the assembly.

18 Claims, 5 Drawing Sheets

CML01717AT DUNN

CML01717AT DUNN

CML01717AT DUNN

CML01717AT DUNN

INTEGRATED PATCH ANTENNA AND ELECTRONICS ASSEMBLY AND METHOD FOR FABRICATING

FIELD OF THE INVENTION

This invention is in the field of printed circuit board assemblies, and more particularly in the field of printed board assemblies that include an antenna.

BACKGROUND

Patch antennas are commonly used in electronic equipment. They have an advantage of being effective while not requiring a long radiating element. Current patch antennas are typically fabricated as a unitary device and coupled to a printed circuit board assembly by cables and connectors that are often soldered at both ends to attachment points on the patch antenna and on the printed circuit assembly. The ground plane of the patch antenna must be mechanically and electrically attached to the printed circuit board with solder or conductive epoxy. These techniques add thickness, process complexity and potential reliability problems due to a severe mismatch between the thermal expansion coefficients of the printed circuit board and the antenna dielectric. Such combinations have a total thickness that typically exceeds the thickness of the patch antenna and the circuit board assembly by at least a millimeter and often more. It would be desirable to reduce the total thickness of the combination.

BRIEF DESCRIPTION OF THE DRAWINGS

The present invention is illustrated by way of example and not limitation in the accompanying figures, in which like references indicate similar elements, and in which.

Figure 1:
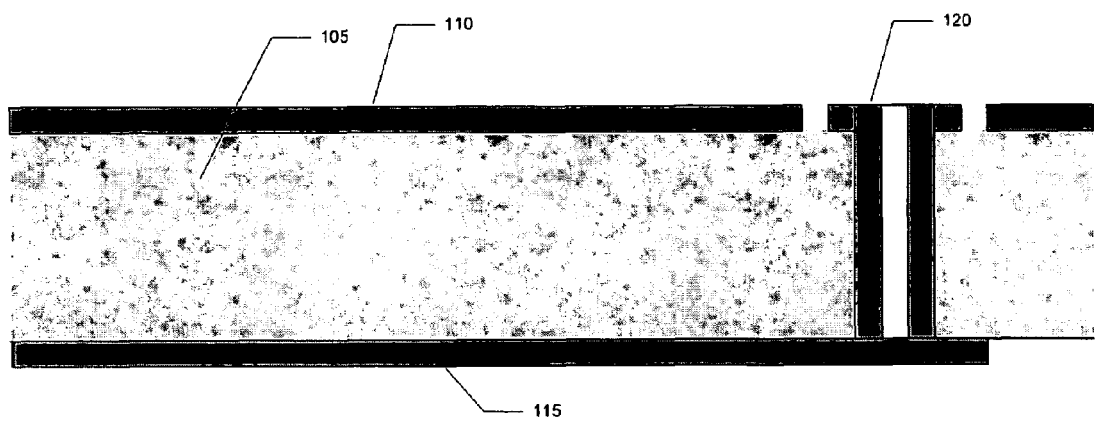
FIG. 1 is a cross sectional elevation view that shows a substantial portion of a typical prior art patch antenna.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including" and/or "having", as used herein, are defined as comprising. The term "coupled", as used herein with reference to electro-optical technology, is defined as connected, although not necessarily directly, and not necessarily mechanically.

Before describing in detail the particular integrated patch antenna and electronics assembly in accordance with the present invention, it should be observed that the present invention resides primarily in combinations of method steps and apparatus components related to printed circuit boards and patch antennas. Accordingly, the apparatus components and method steps have been represented where appropriate by conventional symbols in the drawings, showing only those specific details that are pertinent to understanding the present invention so as not to obscure the disclosure with details that will be readily apparent to those of ordinary skill in the art having the benefit of the description herein.

Referring to FIG. 1, a cross sectional elevation view of a portion of a typical prior art patch antenna 100 is shown. The patch antenna 100 comprises an antenna dielectric layer 105, a ground plane 110, a conductive metal foil antenna patch 115, and an antenna coupling plated through hole 120. The antenna dielectric 105 is typically a single structure made of material that has a dielectric constant that is relatively stable over the operating temperature range of the patch antenna while also providing sufficient structural integrity to withstand impact and bending stresses during fabrication, handling, and operation. The structure material may be either a homogeneous dielectric or a multi-phase dielectric material, for example a polymer filled with ceramic particles or glass fibers. An example of such material is TMM-10, a barium titanate-filled polymer material manufactured by Rogers Corporation of Rogers, Conn. The thickness of the antenna dielectric is determined by the RF properties of the antenna dielectric and the desired antenna performance (gain, bandwidth, etc.) The thickness of some antenna dielectrics is limited on the low end by the somewhat poor structural integrity of heavily filled multi-phase materials. The antenna coupling plated through hole 120 facilitates convenient mounting of and electrical connection of the patch antenna 100 from one side of the patch antenna 100 to an electronic circuit board assembly (not shown). It will be appreciated that the typical thickness of the antenna dielectric 105 plus the additional distance needed between the patch antenna 100 and an electronic board assembly to effect mounting typically make the total thickness of the patch antenna 100 and the electronic circuit board assembly at least several millimeters greater than the electronic circuit board assembly itself. Furthermore, when the antenna and printed circuit board are manufactured separately, they both must have the structural integrity to withstand multiple printed circuit board process steps.

Figure 2:
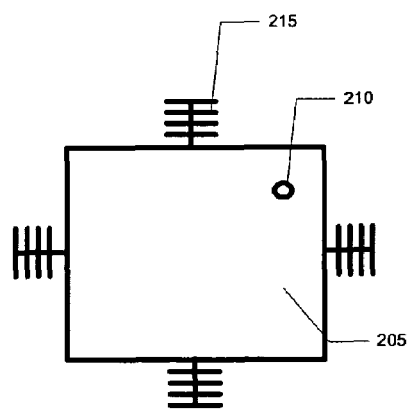
FIG. 2 is a plan view that shows an exemplary antenna patch that is typical of the prior art patch antenna and is exemplary of an antenna patch in accordance with some embodiments of the present invention.

Referring to FIG. 2, a plan view of an exemplary antenna patch 200 is shown that is typical of the prior art patch antenna 100 and is exemplary of an antenna patch in accordance with some embodiments of the present invention. The antenna patch 200 comprises a contiguous area 205, an antenna coupling plated through hole 210 (which is equivalent to the antenna coupling plated through hole 120 in the prior art patch antenna 100), and tuning patterns 215. The tuning patterns can be trimmed after fabrication for precise tuning of the patch antenna 100.

Figure 3:
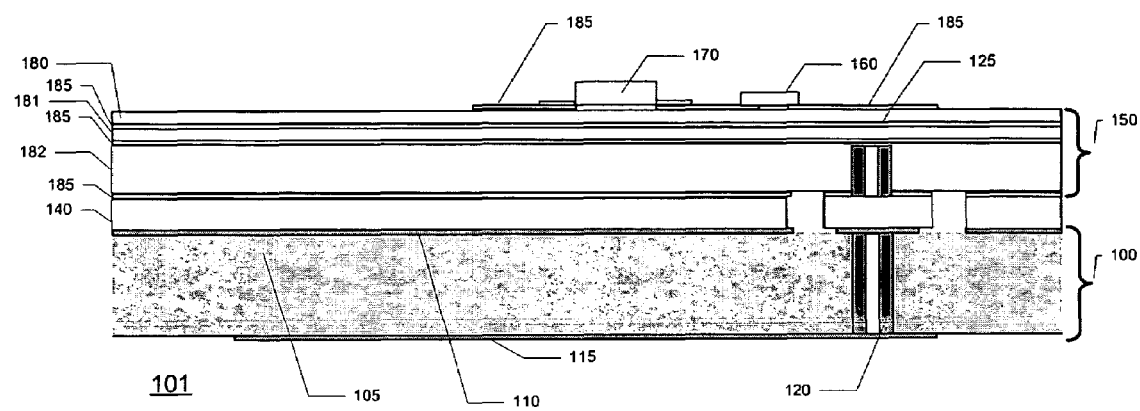
FIG. 3 is a cross sectional elevation view of the prior art patch antenna 100 assembled to an electronics board 150.

Referring to FIG. 3, a cross sectional elevation view is shown of the prior art patch antenna 100 assembled to an electronics board 150 having three printed circuit dielectric layers 180, 181, 182 and four conductive metallic layers 185. Two of the printed circuit dielectric layers 181, 182 that are internal may have embedded components (not shown in FIG. 3) and thee of the conductive metallic layers 185 that are internal may be patterned (not shown in FIG. 3). The electronics board 150 has a number of electronic components mounted on the outermost conductive metallic layer 185, of which only two are shown—an integrated circuit 170 that generates a signal that is coupled through a surface mount resistor 160 to the plated through hole 125. The patch antenna 100 is fastened to the electronics board 150 by a conductive adhesive or solder 140. This approach to fabricating a patch antenna and electronics board assembly 101 involves some complexity in accomplishing the joining of the two sub-assemblies, and may require compromise in selecting an adhesive that reduces the difficulty of joining while at the same time providing a highly conductive interface with thermal characteristics that best match both the patch antenna and printed circuit board thermal characteristics. Furthermore, with this approach to fabricating a patch antenna and electronics board assembly, the printed circuit dielectric layer 182 is typically made thicker (e.g., 500 microns) than the other printed circuit dielectric layers 180, 181 (e.g., 50 microns) to provide handling strength during fabrication of the electronics board 150, and the adhesive layer may be in the range of 75 to 500 microns. The assembly 101 may be made thinner by using a thinner printed circuit dielectric layer 182, but this will typically incur a trade-off of more difficult handling and increased waste during the fabrication process.

Figure 4:
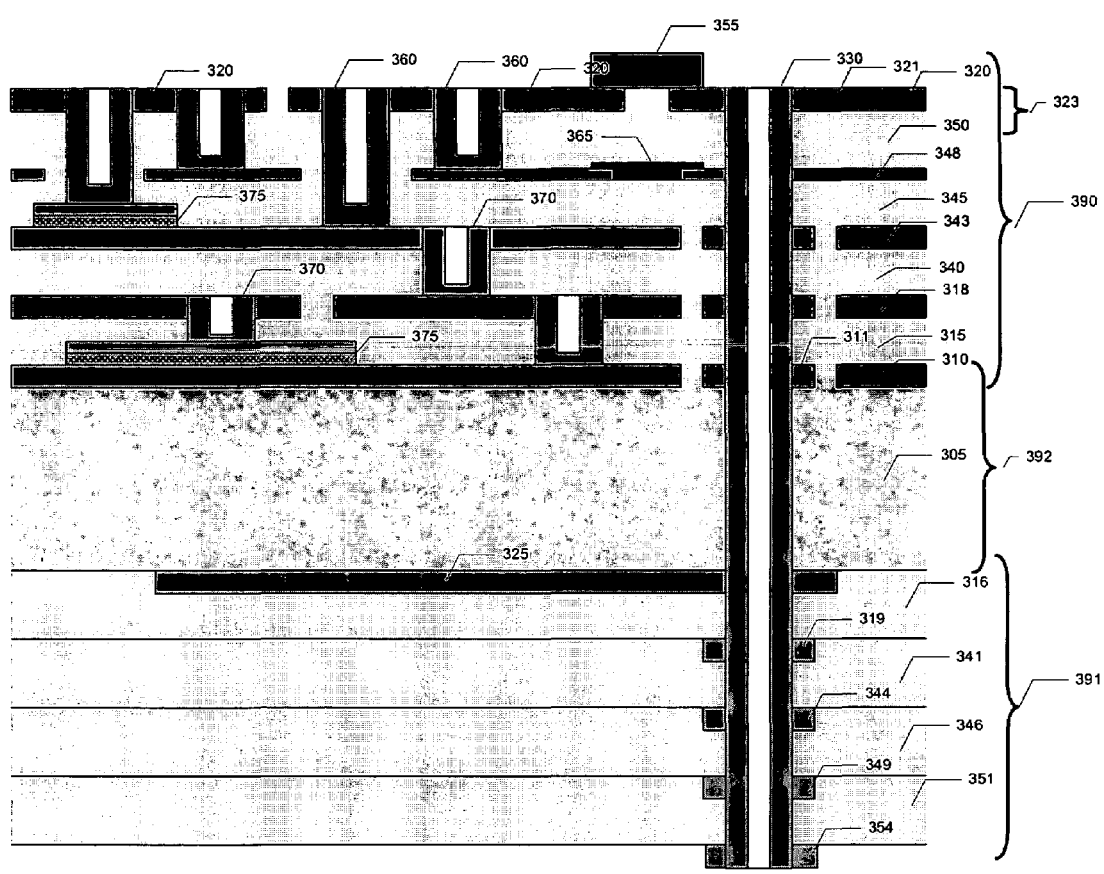
FIG. 4 is a cross sectional elevation view that shows a substantial portion of an integrated patch antenna and electronics assembly (IPAEA), in accordance with some embodiments of the present invention.

Referring to FIG. 4, a cross sectional elevation view of a substantial portion of an integrated patch antenna and electronics assembly (IPAEA) 300 is shown, in accordance with some embodiments of the present invention. The IPAEA 300 comprises an antenna dielectric layer 305, a ground plane layer 310, a printed circuit dielectric layer 315 disposed on the ground plane layer, a conductive metal foil layer 320 on a component surface 323 of a component side 390 of the IPAEA 300, and a conductive metal foil antenna patch 325. The antenna dielectric layer 305, the ground plane layer 310 and the conductive metal foil antenna patch 325 form a patch antenna 392. The ground plane layer 310 is disposed on a first side of the antenna dielectric layer 305. The printed circuit dielectric layer 315 is disposed on the ground plane layer 310 opposite the antenna dielectric layer 305, and forms, with the ground plane layer 310, a portion of the component side of the IPAEA 300. The conductive metal foil layer 320 is patterned for surface attachment of at least one electronic component, such as surface mount capacitor 355. The conductive metal foil antenna patch 325 is disposed on a second side of the antenna dielectric layer 305, forming a portion of a patch side 391 of the IPAEA 300. The term "disposed on" in the context of this description of antenna patch 325' means that the antenna patch is a patterned layer that is directly adjacent to the antenna dielectric layer, as would be the case when it is formed on the surface of the antenna dielectric layer 305 by lamination of a metal foil followed by subtractive patterning of the foil, or by sputtering, evaporation, or electroless plating of a metal seed layer followed by electrolytic plating of a metal and patterning of the metal by additive, semi-additive, or subtractive means known in the art.

The ground plane layer 310 serves as a ground plane for both the patch antenna 392 and electronics in the component side of the IPAEA 300, which are coupled to the patch antenna 392 to transmit or receive signals using the patch antenna 392. In some embodiments the ground plane 310 consists essentially of a patterned unitized conductive metal layer. By this is meant that the conductive metal layer may be formed of conductive metals and/or metal alloys such as (but not limited to) copper, nickel, silver, and gold, or plated layers of conductive metals. However, in these embodiments, the unitized conductive metal layer 310 does not comprise layers of conductive metals joined by conductive adhesives, such as would be the case when two single or multilayer circuit board assemblies are formed into one assembly by joining them using a conductive adhesive or solder.

The antenna dielectric 305 is a planar structure that is generally compatible with printed circuit fabrication techniques, and comprises either a unitary structure or may comprise meta-structures. The structure (or each structure in a meta-structure) comprises either a homogeneous dielectric or a multi-phase dielectric material, such as a powder filled polymer.

The IPAEA 300 may further comprise an antenna coupling plated through hole 330 coupling the conductive metal foil antenna patch 325 to an attachment pattern 321 of conductive metal foil that is a portion of the patterned conductive metal foil layer 320 on the component surface 323 of the IPAEA 300.

In some embodiments, there may be two or more antenna coupling plated through holes (not shown in FIG. 4). The additional antenna coupling plated through holes may be for the purpose of coupling differing versions of electrical signals from electronics on the component side 390 of the IPAEA 300 to the antenna patch 325, so each antenna coupling plated through hole may have its own attachment pattern.

The IPAEA 300 may further comprise one or more additional printed circuit dielectric layers, which in the example shown in FIG. 4 are printed circuit dielectric layers 316, 340, 341, 345, 346, 350, and 351. When there is only one printed circuit dielectric layer 315, then the conductive metal foil layer 320 will be on the surface of the printed circuit dielectric layer 315, which would be the component surface of the component side 390 of the IPAEA 300. Regardless of the number of printed circuit dielectric layers, the ground plane layer 310 is patterned with an isolated ring 311 that is coupled to the antenna coupling plated through hole 330 when there is an antenna coupling plated through hole 330. When there are more than one antenna coupling plated through holes, an isolated ring may be used for each antenna coupling plated through hole.

The printed circuit dielectric layers on the patch side 391 of the IPAEA 300 (four layers 316, 341, 346, 351 are shown in the example in FIG. 4) are electrically non-functional, but may provide important manufacturing and reliability advantages. In some cases, depending upon the material and thickness of the antenna dielectric 305 and the materials and thicknesses of the printed circuit dielectric layers 315, 340, 345, and 350 and of the metal layers 318, 343, 348, and 320, an unbalanced fabrication comprising more printed circuit layers on the component side 390 of the IPAEA 300 than on the patch side 391 may lead to warping during fabrication as the materials are applied to the IPAEA at elevated temperatures and pressures and subsequently allowed to cool to room temperature, or later during use when the IPAEA is exposed to temperature changes in the operating environment. In these cases, providing additional printed circuit layers on the patch side 391 can help to balance the structure and prevent such warping. An additional advantage may be improved mechanical robustness, particularly when the antenna dielectric 305 is a weak or brittle material, such as TMM-10, and the printed circuit dielectric layers 316, 341, 346, 351 are a strong and pliable material, such as glass fiber-reinforced epoxy. The printed circuit dielectric layers 316, 341, 346, 351 may be typically very thin, for example 50 microns, compared to the antenna dielectric layer 305, which may be, for example, 1000 microns thick. Thus the printed circuit dielectric layers 316, 341, 346, 351 on the patch side 391 do not add appreciably to the total IPAEA thickness, and it will be appreciated that the IPAEA 300 assembly can be considerably thinner than the assembly 101 (FIG. 3). When there are one or more printed circuit dielectric layers on the patch side 391 of the IPAEA 300, then one of them 316 is disposed on the conductive metal foil antenna patch 325 and one of them 351 has an outer surface on the patch side 391 of the IPAEA 300. When there is only one printed circuit dielectric layer on the patch side of the IPAEA 300, then the one having the outer surface is the one disposed on the conductive metal foil antenna patch 325. When the printed circuit dielectric layers are processed together in pairs, they become mutually reinforcing, allowing the printed circuit portion to consist entirely of very thin dielectric layers that rely on the antenna dielectric as a rigid process substrate.

When there are two or more layers of printed circuit dielectric layers on the patch side of the IPAEA 300 (four layers 316, 341, 346, 351 are shown in the example in FIG. 4), then the IPAEA 300 may further comprise no more than one capture pad around each antenna coupling plated through hole between each pair of the at least two printed circuit dielectric layers on the patch side of the IPAEA 300. Thus, in the example shown in FIG. 4, with one antenna coupling plated through hole 330, there is one capture pad 319, 344, 349 between each pair ([316,341], [341, 346], [346,351]) of printed circuit dielectric layers. In addition, there is a capture pad 354 on the outer surface of printed circuit dielectric layer 351. It will be appreciated that the printed circuit dielectric layers 315, 316, 340, 341, 345, 346, 350, 351 are typically made of a conventional polymer, but may be made of other conventional or new materials, and that the materials, especially polymer materials, may be glass filled.

The IPAEA 300 may further comprise one or more blind vias 360, buried blind vias 370, embedded resistors 365, and/or embedded capacitors 375 in the component side 390 of the IPAEA 300. It will be appreciated that no electronic components are embedded in or mounted on the patch side of the IPAEA, and no portion of any vias or holes, except the one or more antenna coupling plated through holes, are formed in the ground plane 310, the antenna dielectric 305, or the patch side of the IPAEA 300, in order to avoid degradation to or creating anomalies in the radiation pattern of the patch antenna 392 in the direction away from the ground plane 310.

Figure 5:
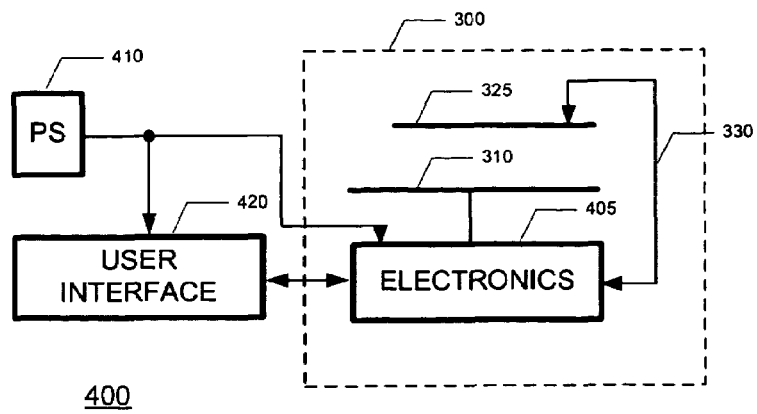
FIG. 5 is an electronic block diagram that shows electronic equipment that includes the IPAEA, in accordance with some embodiments of the present invention.

Referring to FIG. 5, an electronic block diagram shows electronic equipment 400 that includes the IPAEA 300, in accordance with some embodiments of the present invention.

The electronic equipment comprises the IPAEA 300, a user interface 420, and a power supply 410. The electronic equipment may be any of a wide variety of wirelessly communicating electronic devices, including but not limited to such devices as a cellular handset, a GPS receiver, a local area network node, a police radio, a remote control, and a garage door opener. The power supply 410 may be a battery or an AC branch circuit converter. The user interface may be any of well known interface items, such as a display, keyboard, switches, lights, etc. The IPAEA comprises the ground plane 310, the antenna patch 325, and interconnected electronic components 405 located in the component side 390 of the IPAEA 300. The interconnected components may include such devices as one or more microprocessors, application specific integrated circuits, logic circuits, analog circuits, and power conditioning circuits. Possibly, there may be no user interface when the electronic equipment, for example, simply interconnects wired communications to wireless communications. Possibly, there may be no power supply when the electronic equipment 400 gets power from energy intercepted by the patch antenna 325 (as for radio frequency identification tags).

Figure 6:
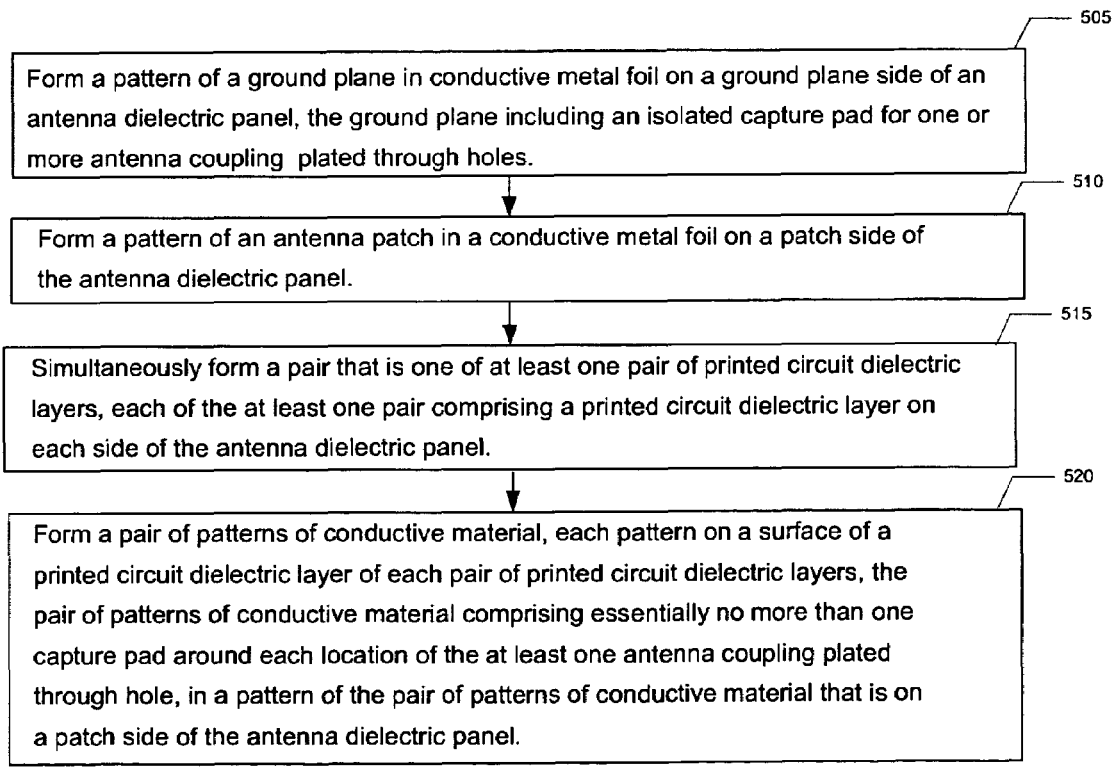
FIG. 6 is a flow chart that shows a method of fabricating an integrated patch antenna and electronics assembly, in accordance with some embodiments of the present invention.

Referring now to FIG. 6, a flow chart shows a method of fabricating an integrated patch antenna and electronics assembly, in accordance with some embodiments of the present invention. Reference is made to elements in FIG. 4. At step 505, a pattern of a ground plane 310 is formed in conductive metal foil that is on a ground plane side of an antenna dielectric panel, the ground plane 310 including an isolated capture pad for each of one or more antenna coupling plated through holes 330. The antenna panel comprises an antenna dielectric 305 and conductive metal foil that is on both sides of the antenna dielectric 305. A pattern of an antenna patch is formed in a conductive metal foil on a patch side of the antenna dielectric panel at step 510. A pair that is one of at least one pair of printed circuit dielectric layers is simultaneously formed at step 515, each pair comprising a printed circuit dielectric layer on each side of the antenna dielectric panel. In the example shown in FIG. 4, there are 4 such pairs ([315, 316], [340, 341], [345, 346], [350, 351]). At step 520, a pair of patterns of conductive material is formed. For the example in FIG. 4, patterned conductive metal foil layers [318, 319] are such patterns of conductive material. Each pattern of each pair is formed on a surface of a printed circuit dielectric layer of each pair of printed circuit dielectric layers. For the example just described, the pair of patterned conductive materials [318, 319] are formed on the surfaces of the pair of printed circuit dielectric layers [315, 316]. The pair of patterns of conductive material comprise essentially no more than one capture pad around each location of the at least one antenna coupling plated through hole, in the pattern of the pair of patterns of conductive material that is on the patch side of the antenna dielectric panel. Continuing the example of FIG. 4, the pair of patterns of conductive material [318, 319] comprise essentially no more than one capture pad 319 around each location of the at least one antenna coupling plated through hole 330, in the pattern 319 of the pair of patterns of conductive material that is on the patch side 391 of the antenna dielectric panel. Step 520 provides a minimal amount of conductive material 319, 344, 349, 354 around the antenna coupling plated through hole 330 that aids the formation of the plating in the wall of the antenna coupling plated through hole 330 (by "drawing" the conductive material into the hole), thereby assuring a good connection at the antenna patch pattern 325, and in addition improves mechanical robustness of the plated through hole by providing a mechanical "anchor" at each dielectric layer surface. The ground plane 310, the antenna patch 325, and the patterned conductive foil metal layers 318, 319, 343, 344, 348, 349, 320, and 354 may be formed by a conventional forming process, such as subtractive etching or additive plating processes or a combination thereof, or by new processes. In a step not shown in FIG. 6, when the antenna patch 325 includes tuning patterns 215 (FIG. 2), one or more holes may be drilled or laser cut in the printed circuit dielectric layers 351, 346, 341, 316 and into a tuning pattern 215 to disconnect one or more branches of the tuning pattern and thereby tune the patch antenna after the printed circuit dielectric layers 351, 346, 341, 316 have been formed, or in some instances, it may be practical to perform the tuning before the printed circuit dielectric layers 351, 346, 341, 316 have been formed.

Figure 7:
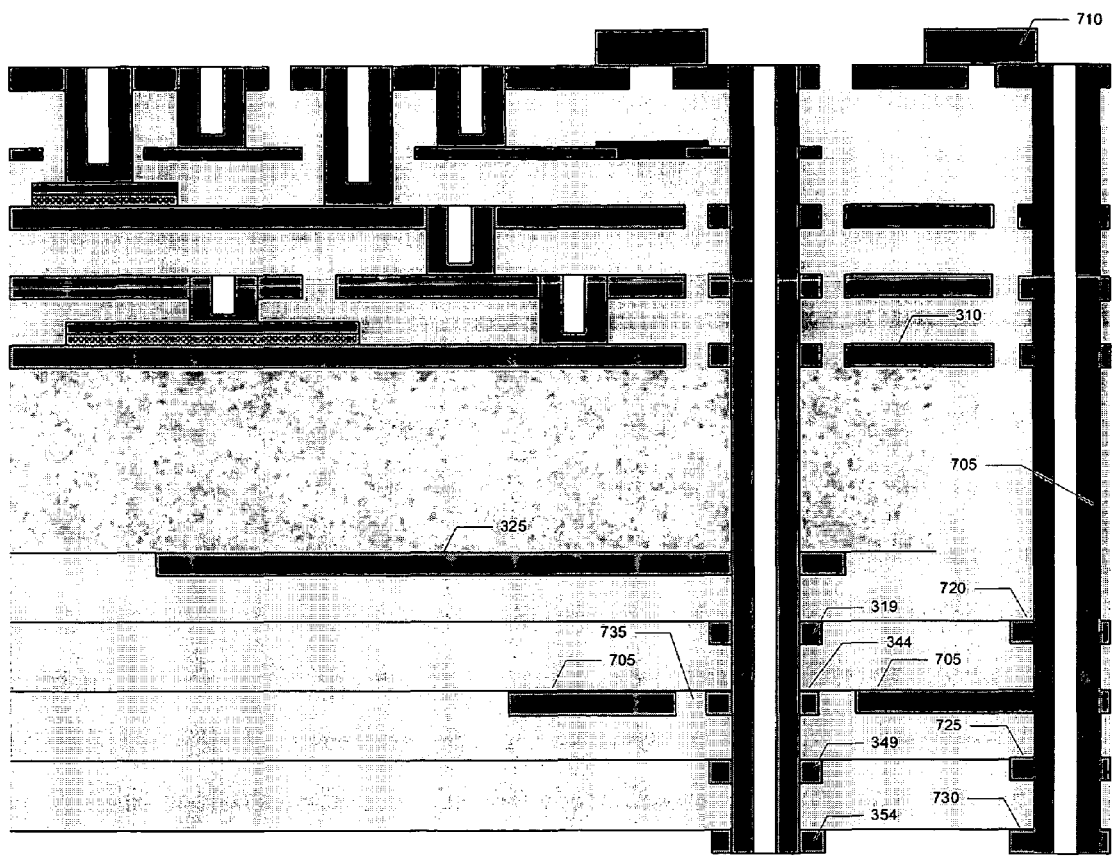
FIG. 7 is a cross sectional elevation view of a substantial portion of an integrated patch antenna and electronics assembly, in accordance with some embodiments of the present invention.

Referring now to FIG. 7, a cross sectional elevation view of a substantial portion of an integrated patch antenna and electronics assembly (IPAEA) 700 is shown, in accordance with some embodiments of the present invention. The IPAEA 700 is substantially the same as the IPAEA 300, except that it has a second antenna patch 705 that partially overlaps the first antenna patch 325. The second antenna patch 705 is coupled to a signal generating component (not shown in FIG. 7) through a surface mount capacitor 710 and plated through hole 715. Capture pads 319, 344, 349, 354 are provided as for IPAEA 300, and capture pads 720, 725, and 730 are provided for antenna patch 705, but, in addition, an isolating ring 735 surrounds capture pad 344 within the antenna patch 705. The ground plane 310 and the antenna patch 705 form a second patch antenna that is activated when a signal is applied to the antenna patch 705. The antenna patches 325 and 705 are typically operated in a mutually exclusive fashion, but there may be circumstances when they could be operated simultaneously. More antenna patches could be provided within other layers on the patch side of the IPAEA 700, or two antenna patches could co-exist in one layer, generally in a non-overlapping configuration. When one antenna patch partially overlies another, the feed through holes from one patch will typically have isolation rings in the antenna patch of the other if they pass through it.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

What is claimed is:

1. An integrated patch antenna and electronics assembly, comprising:
    an antenna dielectric layer;
    a ground plane layer comprising a patterned conductive metal layer disposed on a first side of the antenna dielectric layer;
    a printed circuit dielectric layer disposed on the ground plane layer opposite the antenna dielectric layer, forming with the ground plane layer a portion of a component side of the integrated patch antenna and electronics assembly;
    a conductive metal foil layer, patterned for surface attachment of at least one electronic component on a component surface of the component side of the integrated patch antenna and electronics assembly;
    a conductive metal foil antenna patch disposed on a second side of the antenna dielectric layer, forming a portion of a patch side of the integrated patch antenna and electronics assembly; and
    an antenna coupling plated through hole coupling the conductive metal foil antenna patch to an attachment pattern of conductive metal foil that is a portion of the conductive metal foil layer on the component surface of the integrated patch antenna and electronics assembly.

2. The integrated patch antenna and electronics assembly according to claim 1, wherein the ground plane layer is patterned with an isolated ring that is coupled to the antenna coupling plated through hole.

3. An integrated patch antenna and electronics assembly, comprising:
    an antenna dielectric layer;
    a ground plane layer comprising a patterned conductive metal layer disposed on a first side of the antenna dielectric layer;
    a printed circuit dielectric layer disposed on the ground plane layer opposite the antenna dielectric layer, forming with the ground plane layer a portion of a component side of the integrated patch antenna and electronics assembly;
    a conductive metal foil layer, patterned for surface attachment of at least one electronic component, on a component surface of the component side of the integrated patch antenna and electronics assembly;
    a conductive metal foil antenna patch disposed on a second side of the antenna dielectric layer, forming a portion of a patch side of the integrated patch antenna and electronics assembly;
    one or more additional printed circuit dielectric layers, one of which is disposed on the conductive metal foil antenna patch and one of which has an outer surface on the patch side of the integrated patch antenna and electronics assembly; and
    an antenna coupling plated through hole that couples the conductive metal foil antenna patch to an attachment pattern of conductive metal foil that is a portion of the conductive metal foil layer on the component surface of the integrated patch antenna and electronics assembly.

4. The integrated patch antenna and electronics assembly according to claim 3, wherein there are at least two printed circuit dielectric layers on the patch side of the integrated patch antenna and electronics assembly, further comprising no more than one capture pad around each antenna coupling plated through hole between each pair of the at least two printed circuit dielectric layers on the patch side of the integrated patch antenna and electronics assembly.

5. An integrated patch antenna and electronics assembly, comprising:
an antenna dielectric layer;
a ground plane layer comprising a patterned conductive metal layer disposed on a first side of the antenna dielectric layer;
a printed circuit dielectric layer disposed on the ground plane layer opposite the antenna dielectric layer, forming with the ground plane layer a portion of a component side of the integrated patch antenna and electronics assembly;
a conductive metal foil layer, patterned for surface attachment of at least one electronic component, on a component surface of the component side of the integrated patch antenna and electronics assembly; and
a conductive metal foil antenna patch disposed on a second side of the antenna dielectric layer, forming a portion of a patch side of the integrated patch antenna and electronics assembly,
wherein the antenna dielectric layer comprises one of a unitary structure and meta-structures.

6. An integrated patch antenna and electronics assembly, comprising:
an antenna dielectric layer;
a ground plane layer comprising a patterned conductive metal layer disposed on a first side of the antenna dielectric layer;
a printed circuit dielectric layer disposed on the ground plane layer opposite the antenna dielectric layer, forming with the ground plane layer a portion of a component side of the integrated patch antenna and electronics assembly;
a conductive metal foil layer, patterned for surface attachment of at least one electronic component, on a component surface of the component side of the integrated patch antenna and electronics assembly; and
a conductive metal foil antenna patch disposed on a second side of the antenna dielectric layer, forming a portion of a patch side of the integrated patch antenna and electronics assembly,
wherein the antenna dielectric layer comprises at least one structure, each structure comprising one of a homogeneous dielectric and a multi-phase dielectric material.

7. An integrated patch antenna and electronics assembly, comprising:
an antenna dielectric layer;
a ground plane layer comprising a patterned conductive metal layer disposed on a first side of the antenna dielectric layer;
a printed circuit dielectric layer disposed on the ground plane layer opposite the antenna dielectric layer, forming with the ground plane layer a portion of a component side of the integrated patch antenna and electronics assembly;
a conductive metal foil layer, patterned for surface attachment of at least one electronic component, on a component surface of the component side of the integrated patch antenna and electronics assembly;
a conductive metal foil antenna patch disposed on a second side of the antenna dielectric layer, forming a portion of a patch side of the integrated patch antenna and electronics assembly; and
an equal number of printed circuit dielectric layers in the component side and in the patch side of the integrated patch antenna and electronics assembly.

8. An integrated patch antenna and electronics assembly, comprising:
an antenna dielectric layer;
a ground plane layer comprising a patterned conductive metal layer disposed on a first side of the antenna dielectric layer;
a printed circuit dielectric layer disposed on the ground plane layer opposite the antenna dielectric layer, forming with the ground plane layer a portion of a component side of the integrated patch antenna and electronics assembly;
a conductive metal foil layer, patterned for surface attachment of at least one electronic component, on a component surface of the component side of the integrated patch antenna and electronics assembly;
a conductive metal foil antenna patch disposed on a second side of the antenna dielectric layer, forming a portion of a patch side of the integrated patch antenna and electronics assembly; and
at least one component attached to the conductive metal foil layer on the component surface.

9. An electronic equipment comprising the integrated patch antenna and electronics assembly according to claim 8, and further comprising one or both of a power supply and user interface.

10. An integrated patch antenna and electronics assembly, comprising:
an antenna dielectric layer;
a ground plane layer comprising a patterned conductive metal layer disposed on a first side of the antenna dielectric layer;
a printed circuit dielectric layer disposed on the ground plane layer opposite the antenna dielectric layer, forming with the ground plane layer a portion of a component side of the integrated patch antenna and electronics assembly;
a conductive metal foil layer, patterned for surface attachment of at least one electronic component, on a component surface of the component side of the integrated patch antenna and electronics assembly; and
a conductive metal foil antenna patch disposed on a second side of the antenna dielectric layer, forming a portion of a patch side of the integrated patch antenna and electronics assembly; and
at least one additional metal foil antenna patch disposed in the patch side of the integrated patch antenna and electronics assembly.

11. An integrated patch antenna and electronics assembly, comprising:
an antenna dielectric layer;
a ground plane layer comprising a conductive metal layer disposed on a first side of the antenna dielectric layer;
a printed circuit dielectric layer disposed on the ground plane layer opposite the antenna dielectric layer;
a conductive metal foil patch antenna disposed on a second side of the antenna dielectric layer;
a conductive metal foil layer, patterned for surface attachment of at least one electric component, on a component surface of a component side of the integrated patch antenna and electronics assembly that includes the ground plane layer and excludes the conductive metal foil patch antenna; and
at least one antenna coupling plated through hole that couples the conductive metal foil antenna patch to the conductive metal foil layer on the component surface of the component side of the integrated patch antenna and electronics assembly.

12. A method of fabricating an integrated patch antenna and electronics assembly, comprising:
    forming a pattern of a ground plane in conductive metal foil on a ground plane side of an antenna dielectric panel, the ground plane including an isolated capture pad for each of one or more antenna coupling plated through holes;
forming a pattern of an antenna patch in a conductive metal foil on a patch side of the antenna dielectric panel; and
    simultaneously forming a pair of printed circuit dielectric layers that is one of at least one pair of printed circuit dielectric layers, each of the at least one pair of printed circuit dielectric layers comprising a printed circuit dielectric layer on each side of the antenna dielectric panel.

13. The method of fabricating an integrated patch antenna and electronics assembly according to claim 12, further comprising forming a pair of patterns of conductive material, each pattern of each pair being formed on a surface of a printed circuit dielectric layer of each pair of printed circuit dielectric layers, the pair of patterns of conductive material comprising essentially no more than one capture pad around each location of the at least one antenna coupling plated through hole, in a pattern of the pair of patterns of conductive material that is on a patch side of the antenna dielectric panel.

14. The method of fabricating an integrated patch antenna and electronics assembly according to claim 12, further comprising forming embedded components in at least one printed circuit dielectric layer that is nearest the component side of the antenna dielectric panel.

15. The method of fabricating an integrated patch antenna and electronics assembly according to claim 12, further comprising forming one or more blind vias between two printed circuit dielectric layers that are nearest the component side of the antenna dielectric panel.

16. The method of fabricating an integrated patch antenna and electronics assembly according to claim 12, wherein at least one of the printed circuit dielectric layers is formed from a glass filled polymer.

17. The method of fabricating an integrated patch antenna and electronics assembly according to claim 12, wherein the forming of the pattern of the ground plane forms a ground plane including at least two antenna coupling plated through holes.

18. The method of fabricating an integrated patch antenna and electronics assembly according to claim 12, wherein the forming of a pattern in the conductive metal foil on the ground plane side of the antenna dielectric panel and the forming of the pattern in the conductive metal foil on the patch side of the antenna dielectric panel are performed essentially simultaneously.

* * * * *